(12) United States Patent
Trask

(10) Patent No.: US 6,271,721 B1
(45) Date of Patent: Aug. 7, 2001

(54) COMMON-BASE TRANSISTOR AMPLIFIERS WITH LINEARITY AUGMENTATION

(76) Inventor: Christopher Trask, 1863 E. Palmcroft Dr., Tempe, AZ (US) 85282-2858

( * ) Notice: Subject to any disclaimer, the term of this patent is extended or adjusted under 35 U.S.C. 154(b) by 0 days.

(21) Appl. No.: 09/338,850

(22) Filed: Jun. 23, 1999

(51) Int. Cl.$^7$ ................................................ G06G 7/12
(52) U.S. Cl. ........................ 327/560; 330/149; 330/98
(58) Field of Search ................................. 327/560, 306; 330/98, 99, 100, 276, 149

(56) References Cited

U.S. PATENT DOCUMENTS

| | | | |
|---|---|---|---|
| 2,663,806 | | 12/1953 | Darlington. |
| 2,782,267 | * | 2/1957 | Beck .................................. 330/263 |
| 3,706,846 | * | 12/1972 | SAiwko ............................. 348/707 |
| 3,723,894 | * | 3/1973 | Benenati ............................. 330/29 |
| 3,792,359 | * | 2/1974 | Carlson .............................. 325/13 |
| 3,911,317 | * | 10/1975 | Candy et al. ...................... 315/30 |
| 3,979,610 | * | 9/1976 | Gordon ............................. 327/540 |
| 3,996,524 | * | 12/1976 | Sechi ................................. 330/18 |
| 4,176,332 | * | 11/1979 | Bachert ............................ 333/218 |
| 4,644,293 | * | 2/1987 | Kennett ............................. 330/296 |
| 4,764,735 | * | 8/1988 | Jones ................................. 330/271 |
| 4,928,072 | * | 5/1990 | Scott ................................. 330/149 |
| 4,980,810 | * | 12/1990 | Mcclanahan et al. .............. 363/16 |
| 5,281,925 | * | 1/1994 | Hulick .............................. 330/296 |
| 5,304,949 | * | 4/1994 | Chun ................................. 330/296 |
| 6,172,563 | * | 1/2001 | Trask ................................ 330/149 |

OTHER PUBLICATIONS

Akgun, M. and M. J. O. Strutt, "Cross Modulation and Nonlinear Distortion in RF Transistor Amplifiers," IRE Transactions on Electron Devices, vol. ED–6, No. 10, Oct. '59, pp. 457–467.

Cattermole, K. W., "Transistor Circuits, 2nd. Ed.," Baywood Pub. Co., 1964, pp. 130–132.

Choma, John, "Harmonic and Intermodulation Distortion in Current–Feedback Bipolar Transistor Amplifiers," Proceedings of the IEE, Part G, vol. 128, No. 5, Oct. '81, pp. 264–268.

Mallingkroot, A. J. and F. M. Gardner, Distortion in Transistor Amplifiers, IEEE Transactions on Electron Devices, vol. ED–10, No. 7, Jul. '63, pp. 288–289.

Oakes, F., "Analysis of the Common–Base Transistor Circuit," Electronic Engineering, Mar. '55, pp. 120–126.

Reynolds, J., "Nonlinear Distortions and Their Cancellation in Transistors," IEEE Transactions on Electron Devices, vol. ED–12, No. 11, Nov. '65, pp. 595–599.

Sapotta, H., "Push–Pull Receiver Front End Stages In Common Base Circuits: The Solution to the Inter–Modulation Problem," VHF Communications, vol. 28, No. 2, Feb. '96, pp. 111–121.

Shea, Richard F., "Principles of Transistor Circuits," Wiley, 1953, pp. 136–141.

Sziklai, G. C., "Symmetrical Properties of Transistors and Their Applications," Proceedings of the IRE, Jun. '53, pp. 717–724.

(List continued on next page.)

Primary Examiner—Timothy P. Callahan
Assistant Examiner—Hai L. Nguyen

(57) ABSTRACT

An augmented common-base transistor amplifier circuit is described, including an input terminal and an output terminal. The amplifier circuit also includes an augmentation circuit, connected from the emitter to the base of the amplifying transistor, which detects an error voltage at the transistor emitter, amplifies and inverts the error voltage, and then applies the amplified error voltage to the base of the amplifying transistor, for the purpose of reducing the emitter error voltage and thus linearizing the common-base amplifier. According to a further embodiment, a second transistor is used for amplifying the emitter error voltage, and a further embodiment uses a transformer for augmentation. Circuits are described for single-ended, push-pull, and complementary amplifiers.

15 Claims, 7 Drawing Sheets

OTHER PUBLICATIONS

Thomas, L. C., "Eliminating Broadband Distortion in Transistor Amplifiers," Bell System Technical Journal, Mar. '68, pp. 315–342.

Van Dijkum, A. H. J. Nieveen and J. J. Sips, "Cross Modulation and Modulation Distortion in AM Receivers Equipped with Transistors," Electronic Applications, vol. 20, No. 3, pp. 107–127.

* cited by examiner

COMMON-BASE TRANSISTOR AMPLIFIERS WITH LINEARITY AUGMENTATION

BACKGROUND OF THE INVENTION

Common-base amplifier circuits have long been recognized for their ability to deliver higher frequency response, higher collector voltage swings, and higher linearity than do their common-emitter counterparts under identical conditions of bias and loading for the same transistor device. Common-base amplifiers are readily adaptable to wide-band RF applications from HF, through VHF, and well into the UHF region of frequencies, and are easily designed with a minimum of effort devoted to input and output matching networks. In addition, common-base amplifiers achieve a higher degree of reverse isolation than do their common-emitter counterparts, thus leading to a greater degree of stability. All of these factors are desirable characteristics in amplifier design. In a conventional common-base amplifier, as shown in FIG. 1, the input resistance is the sum of a fixed resistance and the nonlinear emitter resistance of the transistor, the latter of which is a primary cause of both harmonic and intermodulation distortion. Traditional design techniques reduce this nonlinearity either directly by increasing the fixed input resistance or indirectly by decreasing the nonlinear emitter resistance by increasing the transistor bias current. The former technique is unsuitable for power amplifier applications, and the latter technique reduces the overall power efficiency of the amplifier.

SUMMARY OF THE INVENTION

An augmented common-base transistor amplifier circuit with improved intermoduiation (IM) performance is described which includes a common base transistor amplifier, consisting of an input emitter resistance, a common-base transistor, and an output load resistance. The augmented common-base transistor amplifier circuit further includes an augmentation circuit which detects an error voltage at the emitter of the common-base transistor, and which then inverts and amplifies the detected error voltage as a voltage to be applied at the base of the common-base transistor, thereby reducing the error voltage at the emitter of the common-base transistor and in turn improving the linearity and Fivl performance of the common-base transistor amplifier circuit. In a further embodiment the augmentation is accomplished by the addition of a common-emitter transistor amplifier circuit. In a further embodiment suitable for higher frequency and higher power applications, a transformer is used to perform the augmentation, and a tap is later added to the transformer for the purpose of providing additional current gain to the augmented common-base transistor amplifier circuit for applications requiring additional power gain. In a further embodiment suitable for medium- and high-power applications, a pair of augmented common base transistor amplifiers are arranged as a push-pull amplifier. In a further embodiment suitable for applications requiring higher linearity, a complementary pair of augmented common-base transistor amplifiers are arranged as a complementary amplifier.

BRIEF DESCRIPTION OF THE DRAWINGS

The invention is described in the schematics of FIGS. 1 to 7, in which.

DETAILED DESCRIPTION OF THE PREFERRED EMBODIMENTS

Designers of linear amplifiers, for applications ranging from audio, through HF, VHF, UHF frequencies and beyond, are concerned with elements of system performance which include, but are not limited to, harmonic distortion, intermodulation distortion (IM), power consumption and efficiency, and environmental conditions, particularly temperature. Historically, the IM performance of linear amplifiers is improved by application of feedback or feedforward methods. The former of these is impractical for high frequency power amplifiers due to excessive phase shift in the active device or the feedback network (and very often a combination of both), which causes instability. The latter method is expensive to manufacture, excessively power inefficient, and is generally limited to narrow-band operation. This invention now presents a linear amplifier circuit which achieves a markedly improved IM performance over a wide bandwidth without introducing any instabilities or complex circuitry, and which is power efficient.

Figure 1:
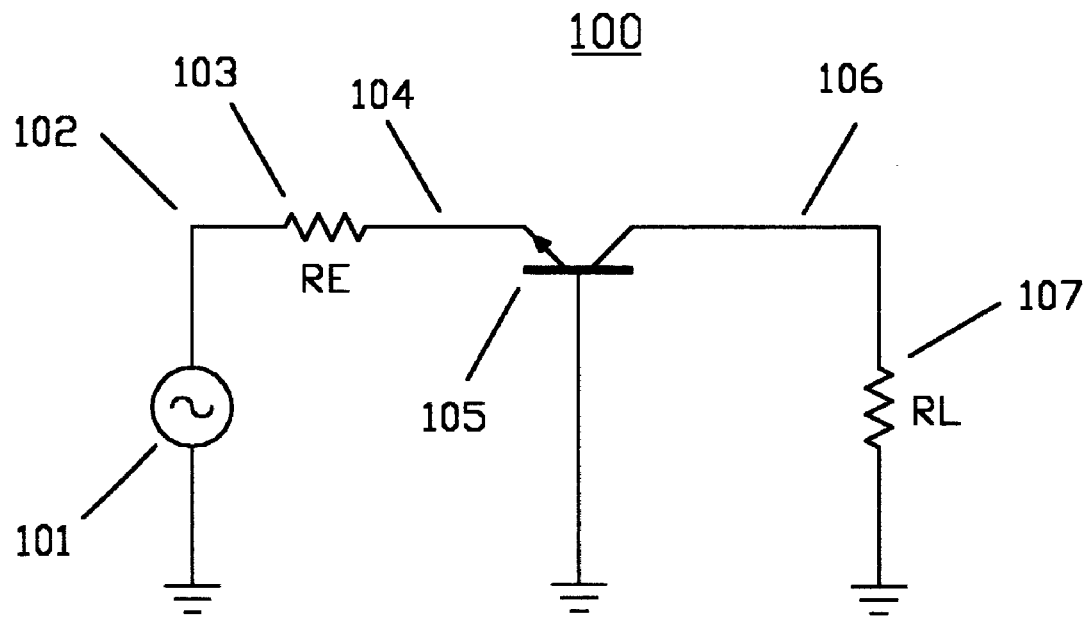
FIG. 1 schematically illustrates the existing prior art, commonly referred to as a common-base transistor amplifier.

Referring to FIG. 1, a common-base transistor amplifier circuit 100 is shown in its most basic form. Here, a transistor 105 has its base connected to ground, hence the term common-base. A resistance 103 (illustrated as a fixed resistance $R_E$ for convenience), is connected from a signal voltage source 101, having an amplitude A and a frequency of $f_s$, to an emitter 104 of transistor 105. A collector of transistor 105 is connected through a load resistance 107 (illustrated as a fixed resistance $R_L$ for convenience) to a common point, such as ground. An output voltage 106 is described by the equation:

$$V_{106} = I_C \times R_L \qquad (1)$$

where $I_C$ is the instantaneous collector current of transistor 105. This collector current is related to the input emitter current $I_E$ by the equation:

$$I_C = \frac{I_E \times h_{fe}}{h_{fe} + 1} \qquad (2)$$

where $h_{fe}$ is the signal current gain of transistor 105. The input emitter current $I_E$ is a result of the input signal voltage at 102 and the input resistance $R_I$, which is approximately described by:

$$R_I = R_E + r_e + \frac{r_{bb}}{h_{fe} + 1} \quad (3)$$

where $r_{bb}$ is the base spreading resistance and $r_e$ is the nonlinear incremental emitter resistance of transistor 105, the latter of which is described by:

$$r_e = \frac{V_{BE}}{I_E} = \frac{V_{BE}}{I_O \times e^{\frac{qV_{BE}}{kT}}} \quad (4)$$

where $L_O$ is the saturation current and $V_{BE}$ is the base-emitter voltage of transistor 105, the latter of which is equal to $-V_{104}$. This voltage constitutes an error voltage 104 at the emitter of transistor 105, which can be described as:

$$V_{104} = V_{102} \times \frac{\left(r_e + \frac{r_{bb}}{h_{fe} + 1}\right)}{R_E + r_e + \frac{r_{bb}}{h_{fe} + 1}} \quad (5)$$

By combining EQ. 3 and EQ. 5, the input resistance $R_I$ can be determined by:

$$R_I = R_E \times \frac{V_{102} + V_{104}}{V_{102}} = R_E \times \frac{V_{102} + V_{BE}}{V_{102}} \quad (6)$$

Examination of EQ. 3 shows that as the second and third terms are reduced, the input resistance $R_I$ more closely approximates the fixed emitter resistance RE. This, in turn, reduces the emitter error voltage $V_{104}$, thus linearizing the input resistance $R_E$ and the input current $I_E$, which results in a linear collector current and thus linearizes the amplifier. Similarly, reducing the emitter error voltage $V_{104}$, creating a virtual ground at the emitter terminal of transistor 105, has the same effect.

Figure 2:
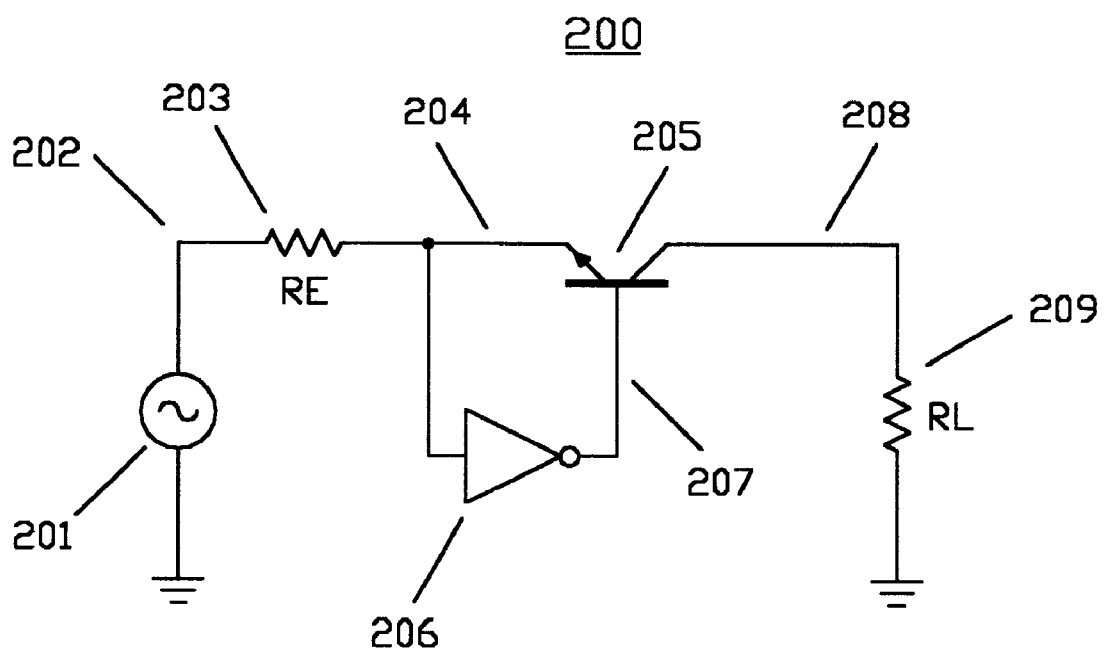
FIG. 2 schematically illustrates an inverting amplifier in a common-base transistor amplifier in accordance with the present invention.

Turning now to FIG. 2, an augmented common-base transistor amplifier circuit 200 in accordance with the present invention is illustrated. Circuit 200 includes an input signal source 201, supplying an input signal voltage 202, which is coupled through a resistance 203 (illustrated as a fixed resistance $R_E$ for convenience) to the emitter of a transistor 205. An augmentation circuit including an inverting voltage amplifier 206 has an input connected to the emitter of transistor 205 and an output connected to the base of transistor 205. The collector of transistor 205 produces an output voltage 208 across a load resistance 209 (illustrated as a fixed resistance $R_L$ for convenience), the opposite end of which is connected to a common point, such as ground. It will of course be understood that in accordance with common practice the input signal source 201 and the load resistance 209 represent any convenient input and output apparatus, respectively. The augmentation amplifier 206 has an inverting voltage gain factor of $-A_V$, making an amplified error voltage 207, which is applied to the base of transistor 205. This voltage is described as:

$$V_{207} = -A_V \times V_{204} \quad (7)$$

where $V_{204}$ is the is the emitter voltage 204. The resulting base-emitter voltage $V_{BE}$ of transistor 205 becomes:

$$V_{BE} = V_{207} - V_{204} = -A_V \times V_{207} - V_{204} = -V_{204} \times (A_V + 1) \quad (8)$$

Substituting EQ. 8 into EQ. 4, we find that the apparent emitter resistance $r_e'$ becomes:

$$r_e' = \frac{V_{204}}{I_E} = \frac{V_{204}}{I_O \times e^{\frac{qV_{204} \times (A_V+1)}{kT}}} = \frac{V_{BE}}{(A_V + 1) \times I_O \times e^{\frac{qV_{BE}}{kT}}} \quad (9)$$

and by substituting EQ. 8 into EQ. 6, we further find that the input resistance $R_I$ is now:

$$R_I = R_E + r_e \times \frac{V_{202} + \frac{V_{BE}}{A_V + 1}}{V_{202}} \quad (10)$$

From inspection of EQ. 9 and EQ. 10 it is obvious that the apparent emitter resistance $r_e'$ is greatly reduced as the voltage gain $A_V$ of augmentation amplifier 206 is increased, and that the input resistance becomes more closely equal to the fixed input resistance $R_E$ as the voltage gain is increased, thus showing that the addition of augmentation amplifier 206 has caused the emitter terminal of transistor 205 to appear as a virtual ground, thus achieving the necessary condition discussed earlier for linearizing a common-base transistor amplifier.

Figure 3:
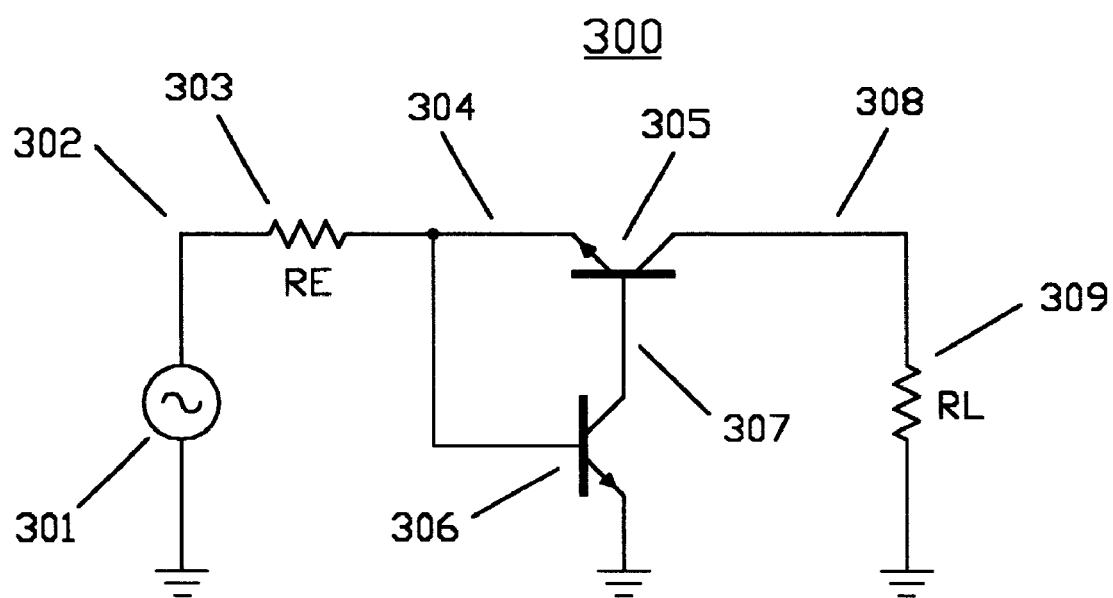
FIG. 3 schematically illustrates a common-emitter transistor amplifier in a common-base transistor amplifier in accordance with the present invention.

In some applications, particularly those at higher frequencies, the use of augmentation amplifier 206 as shown in FIG. 2 may be impractical. Referring specifically to FIG. 3, another embodiment of an augmented common-base transistor amplifier circuit in accordance with the present invention, designated 300, is illustrated. Circuit 300 includes an input signal voltage source 301, supplying an input signal voltage 302, which is coupled through a resistance 303 (illustrated as a fixed resistance $R_E$ for convenience) to the emitter of a transistor 305. An augmentation circuit including a common-emitter transistor amplifier 306 has a base connected to the emitter of transistor 305, a grounded or common emitter, and a collector connected to the base of transistor 305, which produces a base voltage 307 of transistor 305. The collector of transistor 305 produces an output voltage 308 across a load resistance 309 (illustrated as a fixed resistance $R_L$ for convenience), the opposite end of which is connected to a common point, such as ground. in this case, the input current at the emitter of transistor 305 is described as:

$$I_E' = I_{E1} + I_{B2} = I_{B1} \times (h_{fe1} + 1) + \frac{I_{B1}}{h_{fe2}} = \\ = \left(h_{fe1} + 1 + \frac{1}{h_{fe2}}\right) \times I_{O2} \times e^{\frac{qV_{BE}}{kT}} \quad (11)$$

where $h_{fe1}$ is the signal current gain of transistor 305, $h_{fe2}$ is the signal current gain of transistor 306, $I_{O2}$ is the saturation current of transistor 306, and $V_{BE}$ is the base-emitter voltage of transistor 305. Substituting EQ. 11 into EQ. 4, we find that the apparent emitter resistance $r_e'$ becomes approximately:

$$r_e' = \frac{V_{304}}{I_E'} = \frac{V_{304}}{\left(h_{fe1} + 1 + \frac{1}{h_{fe2}}\right) \times I_{O2} \times e^{\frac{qV_{BE}}{kT}}} \quad (12)$$

which is a considerable reduction in the nonlinear emitter resistance of the common-base transistor amplifier, and thus showing that the use of common-emitter transistor amplifier 306 is a suitable alternative for an augmentation circuit for linearizing a common-base transistor amplifier.

Figure 4:
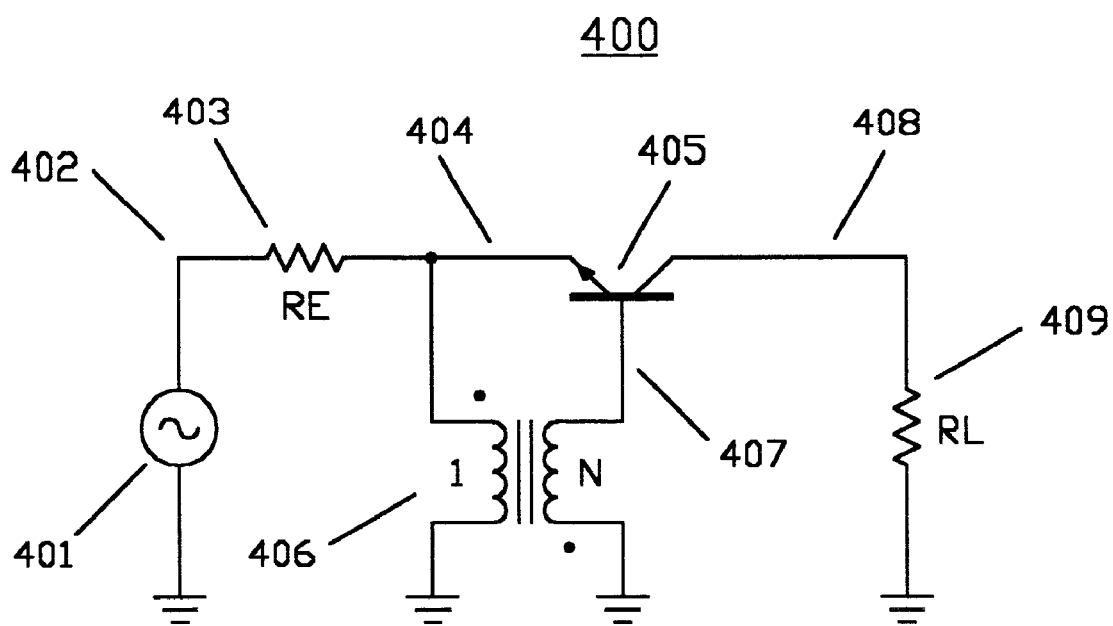
FIG. 4 schematically illustrates a transformer in a common-base transistor amplifier in accordance with the present invention.

For power amplifiers at high frequencies, an augmentation circuit including common emitter transistor amplifier 306 may be impractical. For such applications, the use of a simple transformer can give sufficient voltage gain to provide augmentation. Referring specifically to FIG. 4, another embodiment of an augmented common-base transistor amplifier circuit in accordance with the present invention, designated 400, is illustrated. Circuit 400 includes an input voltage source 401, supplying an input signal voltage 402, which is coupled through a resistance 403 (illustrated as a fixed resistance $R_E$ for convenience) to the emitter of a transistor 405. An augmentation circuit including a transformer 406 has a primary winding connected between the emitter of transistor 405 and a common point, such as ground. A secondary winding of transformer 406 is connected, in reverse phase relative to the primary, between the base of transistor 405 and the common or ground, producing a base voltage 407. The collector of transistor 405 produces an output voltage 408 across a load resistance 409 (illustrated as a fixed resistance $R_L$ for convenience), the opposite end of which is connected to a common point, such as ground. The base-emitter voltage $V_{BE}$, being the difference between base voltage 407 and emitter voltage 404, and the base current $I_B$ for circuit 400 are, respectively:

$$V_{BE} = V_{407} - V_{404} = -N \times V_{404} - V_{404} = -V_{404} \times (N+1) \quad (13)$$

$$I_B = \frac{I_E}{h_{fe}} \quad (14)$$

where N is the turns ratio of the secondary winding to the primary winding of transformer 406. current $I_E'$ equal to:

$$I_E' = I_E - \frac{N \times I_E}{h_{fe}} = I_E \times \left(1 - \frac{N}{h_{fe}}\right) \quad (15)$$

where $$I_E = I_O \times e^{\frac{q(1+N)V_{404}}{kT}} = I_O \times \left[e^{\frac{qV_{404}}{kT}}\right]^{(1+N)} \quad (16)$$

which allows the apparent emitter resistance $r_e'$ to be approximated as:

$$r_e' = \frac{V_{404}}{I_E'} = \frac{V_{404}}{\left(1 - \frac{N}{h_{fe}}\right) \times I_O \times e^{\frac{q(N+1)V_{404}}{kT}}} = \frac{V_{BE}}{(N+1) \times \left(1 - \frac{N}{h_{fe}}\right) \times I_O \times e^{\frac{qV_{BE}}{kT}}} \quad (17)$$

which, compared to EQ. 4, shows that the apparent emitter resistance $r_e'$ decreases dramatically as the turns ratio N of transformer 406 is increased, showing that transformer 406 does provide augmentation of a common-base transistor amplifier.

Figure 5:
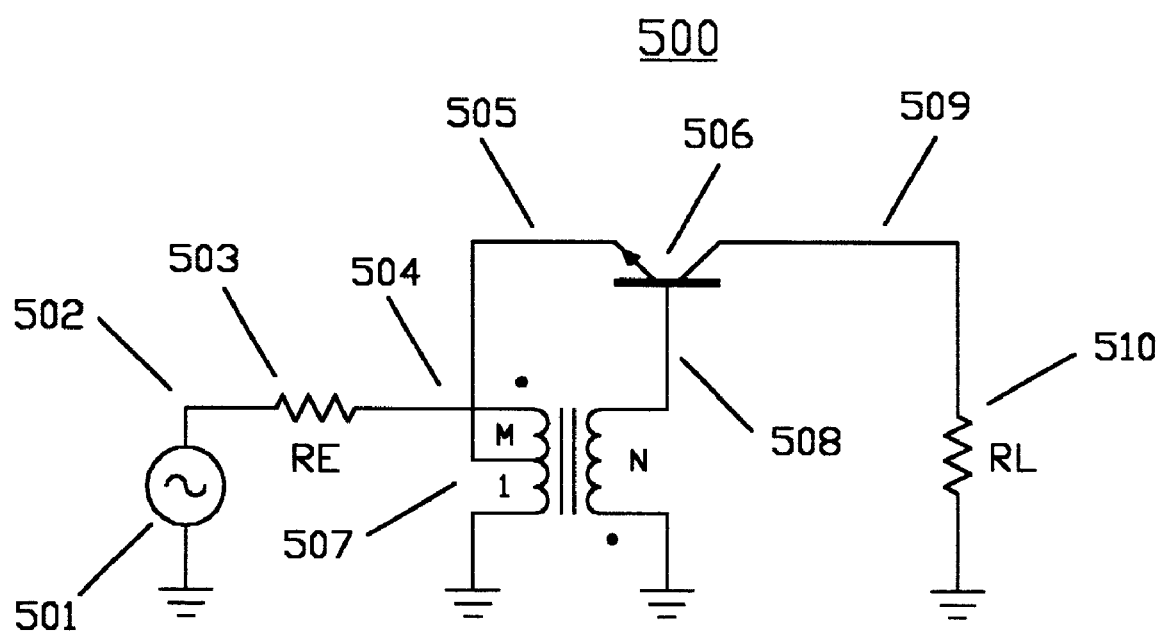
FIG. 5 schematically illustrates the addition of a tap to the primary winding of the transformer in the augmented common-base transistor amplifier of FIG. 4.

The transformer primary of the augmentation circuit of the augmented common-base transistor amplifier 400 can be tapped to provide current gain. Referring specifically to FIG. 5, another embodiment of an augmented common-base amplifier circuit in accordance with the present invention, designated 500, is illustrated. Circuit 500 includes an input signal voltage source 501, supplying an input signal voltage 502, which is coupled through a resistance 503 (illustrated as a fixed resistance $R_E$ for convenience) to one terminal of the primary winding of a transformer 507, the opposite terminal of which is connected to a common point, such as ground. A tap of the primary winding (designated as M turns between the tap and terminal 504) is connected to the emitter of a transistor 506, producing an emitter voltage 505, the actual input voltage now being a voltage at terminal 504. The base of transistor 506 is connected, in reverse phase relative to the primary, through an N turn secondary of transformer 507 to the common or ground, which produces a base voltage 508. The collector of transistor 506 produces an output voltage 509 across a load resistance 510 (illustrated as a fixed resistance $R_L$ for convenience), the opposite end of which is connected to a common point, such as ground. Here, EQ. 13, EQ. 15, EQ. 16, and EQ. 17 are modified, respectively, to describe the various voltages and currents as follows:

$$V_{BE} = V_{508} - V_{505} = -N \times V_{505} - V_{505} = -V_{505} \times \frac{N+1}{M+1} \quad (18)$$

$$I_E' = I_E \times \frac{\left(1 - \frac{N}{h_{fe}}\right)}{M+1} \quad (19)$$

$$I_E = I_O \times \left[e^{\frac{qV_{504}}{kT}}\right]^{\left(\frac{1+N}{1+M}\right)} \quad (20)$$

$$r_e' = \frac{V_{504}}{I_E'} = \frac{V_{504} \times (M+1)}{\left(1 - \frac{N}{h_{fe}}\right) \times I_O \times e^{\frac{q(N+1)V_{504}}{kT}}} = \frac{V_{BE} \times (M+1)^2}{(N+1) \times \left(1 - \frac{N}{h_{fe}}\right) \times I_O \times e^{\frac{qV_{BE}}{kT}}} \quad (21)$$

Comparing EQ. 21 with EQ. 17 shows that the apparent emitter resistance $r_e$ increases exponentially as the tapped transformer primary ratio M is increased, but in comparison with EQ. 4 this is still an improvement in the emitter resistance of the common-base transistor amplifier, provided that the turns ratios M and N are chosen properly.

Figure 6:
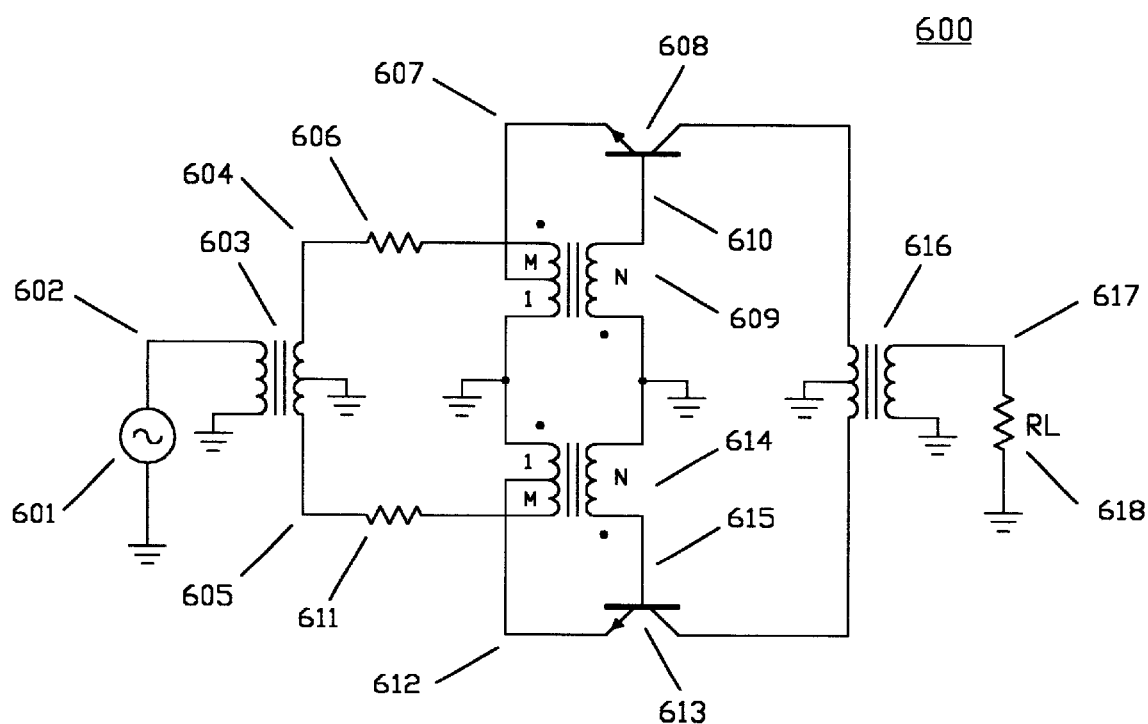
FIG. 6 schematically illustrates a push-pull amplifier incorporating a pair of the augmented common-base transistor amplifiers of FIG. 5.

The use of augmented common-base transistor amplifiers is not limited to single-ended applications. For instance, a pair of single-ended augmented common-base transistor amplifiers can be arranged in a push-pull configuration. Referring specifically to FIG. 6, another embodiment of an augmented common-base transistor amplifier circuit in accordance with the present invention, designated 600, is illustrated. Circuit 600 includes an input signal voltage source 601, supplying an input signal voltage 602, which is coupled to one terminal of the primary winding of an input transformer 603, the opposite terminal of which is connected to a common point such as ground. One terminal of a secondary winding of transformer 603, producing a signal voltage 604, is connected through a resistance 606 to one terminal of the primary winding of an augmentation transformer 609, the opposite terminal of which is connected to the common point, such as ground. The opposite terminal of the secondary winding of input transformer 603, producing a signal voltage 605, is connected through a resistance 611 to one terminal of the primary winding of an augmentation transformer 614, the opposite terminal of which is connected to the common point, such as ground. The secondary winding of input transformer 603 has a centre-tap connected to the common point or ground to provide a reference for the dual input signals.

A tap of the primary winding of augmentation transformer 609 is connected to the emitter of a transistor 608, producing an emitter voltage 607, and a similar tap of the primary winding of augmentation transformer 614 is connected to the emitter of a transistor 613, producing an emitter voltage 612, which is similar to the emitter voltage 607 of transistor 608. The base of transistor 608 is connected, in reverse phase relative to the primary, through an N turn secondary winding of augmentation transformer 609 to the common point or ground, which produces a base voltage 610, and the base of transistor 613 is connected, in reverse phase relative to the primary, through a secondary winding of augmentation transformer 614 to the common point or ground, which produces a base voltage 615, similar to the base voltage 610 of transistor 608. The collector of transistor 608 is connected to one terminal of the primary winding of an output transformer 616, and the collector of transistor 613 is connected to the opposite terminal of the primary winding of output transformer 616. The primary winding of output transformer 616 has a centre-tap connected to the common point or ground to provide a reference for the dual output signals. One terminal of a secondary winding of output transformer 616 is connected through a load resistance 618 (illustrated as a fixed resistance $R_L$ for convenience) to the common point, such as ground, producing an output voltage 617. The opposite terminal of the secondary winding of output transformer 616 is connected to the common or ground.

Figure 7:
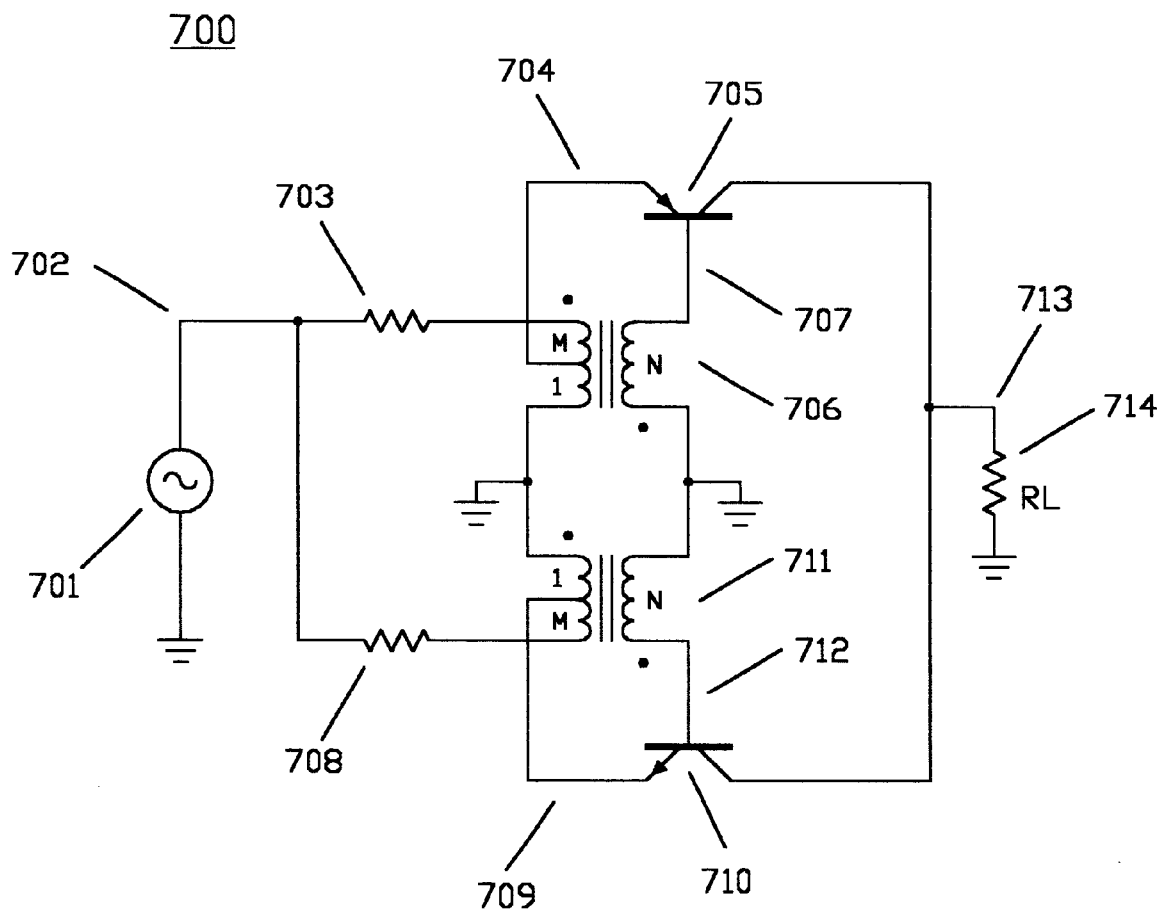
FIG. 7 schematically illustrates a complementary amplifier incorporating a complementary pair of the augmented common-base transistor amplifiers of FIG. 5.

For applications that require a higher degree of linearity, a pair of single-ended augmented common-base transistor amplifiers, one using an NPN amplifying transistor and the other using a PNP amplifying transistor, may be arranged as a complementary, or symmetrical, amplifier. Referring specifically to FIG. 7, another embodiment of an augmented common-base transistor amplifier in accordance with the present invention, designated 700, is illustrated. Circuit 700 includes an input signal voltage source 701, supplying an input signal voltage 702, which is coupled through a resistance 703 to one terminal of the primary winding of an augmentation transformer 706, the opposite terminal of which is connected to a common point such as ground. The input signal voltage 702 is also coupled through a resistance 708 to an one terminal of the primary winding of an augmentation transformer 711, the opposite terminal of which is connected to the common point or ground.

A tap of the primary winding of augmentation transformer 706 is connected to the emitter of a transistor 705 of the positive, or PNP polarity, producing an emitter voltage 704, and a similar tap of the primary winding of augmentation transformer 711 is connected to the emitter of a transistor 710 of the negative, or NPN polarity, producing an emitter voltage 709, which is similar to the emitter voltage 704 of transistor 705. The base of transistor 705 is connected, in reverse phase relative to the primary, through a secondary winding of transformer 706 to the common or ground, producing a base voltage 707. The base of transistor 710 is connected, in reverse phase relative to the primary, through a secondary winding of transformer 711 to the common point or ground, producing a base voltage 712, which is similar to the base voltage 707 of transistor 705. The collectors of transistors 705 and 710 are together connected through a load resistance 714 (illustrated as a fixed resistance $R_L$ for convenience) to the common point or ground, producing an output voltage 713.

Those familiar with the art will recognize that the two applications illustrated in FIGS. 6 and 7 may employ any of the augmented common-base transistor amplifiers described earlier.

Although detailed embodiments of the invention have been described, it should be appreciated that numerous modifications, variations, and adaptations may be made without departing from the scope of the invention as described in the claims. For example, those familiar with the art will recognize that the bipolar transistors shown in the embodiments may be alternatively replaced with field effect transistors. Further, while the terminals of the bipolar transistors described in the various embodiments are referred to as the emitter, base, and collector, it will be understood that these terminals will be the source, gate, and drain, respectively, when the transistors utilized are field effect transistors or other similar types and may be referred to as input, control, and output terminals, respectively, however the titles of the various components and terminals are only intended to enhance the understanding of the disclosure and are not intended to in any way limit the type of component utilized. In addition, it should be understood that the term "common-base transistor amplifier" used throughout this disclosure refers to a general type of amplifier and should not be limited in any way to prior concepts of common-base amplifiers. Also, the tapped two-winding transformers shown in the FIG. 5, FIG. 6, and FIG. 7 may be alternatively replaced with three-winding transformers.

What is claimed is:

1. An augmented common-base transistor amplifier circuit for amplifying an input signal and producing an output signal comprising:

an input terminal for receiving, an input signal;

an output terminal for providing an output signal;

a common-base transistor having an input, a control, and an output, the input coupled to the input terminal of the augmented common-base transistor amplifier circuit, the output coupled to the output terminal of the augmented common-base transistor amplifier circuit, and further comprising a bipolar transistor having an emitter, a base, and a collector coupled to the input, control, and output, respectively, of the common-base transistor; and an augmentation circuit having an input and an output, the input coupled to the input of the common-base transistor and the output coupled to the control of the common-base transistor, wherein the purpose of the augmentation circuit is to receive a signal error voltage at the input of the common-base transistor, amplify and invert the received signal error voltage, and apply the amplified and inverted signal error voltage to the control of the common-base transistor, thereby reducing the input impedance of the common-base transistor and subsequently increasing the linearity of the augmented common-base transistor amplifier circuit.

2. An augmented common-base transistor amplifier circuit, as claimed in claim 1, wherein the augmentation circuit consists of an inverting amplifier having an input coupled to the input of the common-base transistor and an output coupled to the control of the common-base transistor.

3. An augmented common-base transistor amplifier circuit, as claimed in claim 1, wherein the augmentation circuit consists of a common-emitter transistor amplifier circuit, having an input and an output, the input of the common-emitter transistor amplifier circuit coupled to the input of the common-base transistor, and the output of the common-emitter transistor amplifier circuit coupled to the control of the common-base transistor.

4. An augmented common-base transistor amplifier circuit, as claimed in claim 1, wherein the augmentation circuit consists of a transformer having a primary winding and a secondary winding, the primary winding coupled to the input of the common-base transistor and the secondary winding coupled to the control of the common-base transistor in reverse phase relative to the primary winding.

5. An augmented common-base transistor amplifier circuit, as claimed in claim 1, wherein the augmentation circuit consists of a transformer having a tapped primary winding and a secondary winding, the tapped primary winding coupling the input terminal of the augmented common-base transistor amplifier circuit to the input of the common-base transistor, and the secondary winding coupled to the control of the common-base transistor.

6. A push-pull augmented common-base transistor amplifier for amplifying an input signal and producing an output signal comprising:

an input terminal for receiving an input signal;

an output terminal for providing an output signal;

an input transformer, having a primary winding and a centre-tapped secondary winding having a frost output terminal and a second output terminal, the first terminal of the input winding coupled to the input terminal of the push-pull augmented common-base transistor amplifier, the second terminal of the primary winding coupled to a common point, such as ground, and the centre-tap of the secondary winding coupled to the common point;

a first common-base transistor amplifier circuit having an input, a control, and an output, the input connected to the first output terminal of the input transformer, and further comprising a bipolar transistor having an emitter, a base, and a collector coupled to the input, control, and output, respectively, of the first common-base transistor amplifier circuit;

a first augmentation circuit having an input and an output, the input coupled to the input of the first common-base transistor amplifier circuit and the output coupled to the control of the first common-base transistor amplifier circuit;

a second common-base transistor amplifier circuit having an input, a control, and an output, the input connected to the second output terminal of the input transformer, and further comprising a bipolar transistor having an emitter, a base, and a collector coupled to the input, control, and output, respectively, of the second common-base transistor amplifier circuit;

a second augmentation circuit having an input and an output, the input coupled to the input of the second common-base transistor amplifier circuit and the output coupled to the control of the second of the second common-base transistor amplifier circuit; and an output transformer, having a centre-tapped primary winding having a first input terminal and a second input terminal, and a secondary winding, the first input terminal of the primary winding coupled to the output of the first common-base transistor amplifier circuit, the centre tap of the primary winding coupled to a common point, such as ground, the second input terminal of the primary winding coupled to the output of the second common-base transistor amplifier circuit, the first terminal of the secondary winding coupled to the output terminal of the push-pull augmented common-base transistor amplifier and the second terminal of the secondary winding coupled to a common point, such as ground.

7. A complementary augmented common-base transistor amplifier for amplifying an input signal and producing an output signal comprising:

an input terminal for receiving an input signal;

an output terminal for providing an output signal;

a first common-base transistor amplifier circuit having an input, a control, and an output, the input coupled to the input terminal of the complementary augmented common-base transistor amplifier and the output coupled to the output terminal of the complementary augmented common-base transistor amplifier, and further comprising a bipolar transistor of the first polarity having an emitter, a base, and a collector coupled to the input, control, and output, respectively, of the first common-base transistor amplifier circuit;

a first augmentation circuit having an input and an output, the input coupled to the input of the first common-base transistor amplifier circuit and the output coupled to the control of the first common-base transistor amplifier circuit;

a second common-base transistor amplifier circuit having an input, a control, and an output, the coupled to the input terminal of the complementary augmented common-base transistor amplifier and the output coupled to the output terminal of the complementary augmented common-base transistor amplifier, and further comprising a bipolar transistor of the second polarity having an emitter, a base, and a collector coupled to the input, control, and output, respectively, of the second common-base transistor amplifier circuit; and a second augmentation circuit having an input and an output, the input coupled to the input of the second common-base transistor amplifier circuit and the output coupled to the control of the second common-base transistor amplifier circuit.

8. A method of improving the linearity of a common-base transistor amplifier comprising the steps of:

providing a common-base transistor amplifier circuit having an emitter and a base;

providing an input signal to the emitter of the common-base transistor amplifier;

detecting the error voltage at the emitter of the common-base transistor;

amplifying and inverting the detected emitter error voltage; and applying the amplified and inverted emitter error voltage to the base of the common-base transistor amplifier, providing a correction for minimizing the emitter error voltage and thus linearizing the input current of the common-base transistor amplifier.

9. An augmented common-base transistor amplifier circuit for amplifying an input signal and producing an augmented output signal comprising:

a common-base transistor amplifier having an input terminal, a control terminal, and an output terminal; and an augmentation circuit connected between the input terminal and the control terminal for inverting error signals from the input terminal and supplying the inverted error signals to the control terminal.

10. An augmented common-base transistor amplifier circuit as claimed in claim 9 wherein the augmentation circuit includes an inverting amplifier having an input terminal connected to the input terminal of the common-base transistor amplifier and an output terminal connected to the control terminal of the common-base transistor amplifier.

11. An augmented common-base transistor amplifier circuit as claimed in claim 9 wherein the augmentation circuit includes a common-emitter transistor amplifier having an input terminal connected to the input terminal of the common-base transistor amplifier and an output terminal connected to the control terminal of the common-base transistor amplifier.

12. An augmented common-base transistor amplifier circuit as claimed in claim 9 wherein the augmentation circuit includes a transformer amplifier having a primary winding and a secondary winding, with the primary winding connected to the input terminal of the common-base transistor amplifier and the secondary winding connected in reverse phase relative to the primary winding to the control terminal of the common-base transistor amplifier.

13. An augmented common-base transistor amplifier circuit as claimed in claim 9 wherein the augmentation circuit includes a transformer amplifier having a tapped primary winding and a secondary winding, with the primary winding providing a signal input and the tap of the primary winding connected to the input terminal of the common-base transistor amplifier and the secondary winding connected in reverse phase relative to the primary winding to the control terminal of the common-base transistor amplifier.

14. A push-pull augmented common-base transistor amplifier for amplifying an input signal and producing an output signal comprising:

an input power divider having an input terminal for receiving an input signal, a first output terminal, and a second output terminal;

a first common-base transistor amplifier circuit having an input terminal, a control terminal, and an output terminal, the input terminal coupled to the first output terminal of the input power divider;

a first augmentation circuit coupled between the input terminal and the control terminal of the first common-base transistor amplifier circuit for inverting error signals form the input terminal of the first common-base transistor amplifier circuit and supplying the inverted error signal to the control terminal of the first common-base transistor amplifier circuit;

a second common-base transistor amplifier circuit having an input terminal, a control terminal, and an output terminal, the input terminal coupled to the second output terminal of the input power divider;

a second augmentation circuit coupled between the input terminal and the control terminal of the second common-base transistor amplifier circuit for inverting error signals from the input terminal of the second common-base transistor amplifier circuit and supplying the inverted error signal to the control terminal of the second common-base transistor amplifier circuit; and an output power combiner having a first input terminal, a second input terminal, and an output terminal for providing an output signal, the first input terminal coupled to the output of the first common-base transistor amplifier circuit and the second input terminal coupled to the output of the second common-base transistor amplifier circuit.

15. A complementary augmented common-base transistor for amplifying an input signal and producing an output signal comprising:

a first common-base transistor amplifier circuit of the first polarity having an input terminal for receiving an input signal, a control terminal, and an output terminal for providing an output signal;

a first augmentation circuit coupled between the input terminal and the control terminal of the first common-base transistor amplifier circuit for inverting error signals from the input terminal for the first common-base transistor amplifier circuit and supplying the inverted error signal to the control terminal of the first common-base transistor amplifier circuit;

a second common-base transistor amplifier circuit of the second polarity having an input terminal for receiving an input signal, a control terminal, and an output terminal for providing an output signal, the input terminal coupled to the input terminal of the first common-base transistor amplifier circuit and the output terminal coupled to the output terminal of the first common-base transistor amplifier circuit; and a second augmentation circuit coupled between the input terminal and the control terminal of the second common-base transistor amplifier circuit for inverting error signals from the input terminal of the second common-base transistor amplifier circuit and supplying the inverted error signal to the control terminal of the second common-base transistor amplifier circuit.

* * * * *